United States Patent
Boroson et al.

(10) Patent No.: US 8,016,631 B2
(45) Date of Patent: Sep. 13, 2011

(54) DESICCANT SEALING ARRANGEMENT FOR OLED DEVICES

(75) Inventors: Michael L. Boroson, Rochester, NY (US); John W. Hamer, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 385 days.

(21) Appl. No.: 11/941,301

(22) Filed: Nov. 16, 2007

(65) Prior Publication Data

US 2009/0130941 A1     May 21, 2009

(51) Int. Cl.
*H01J 9/00*     (2006.01)

(52) U.S. Cl. .......................................... 445/25; 313/512

(58) Field of Classification Search .......... 313/498–512; 445/24–25
See application file for complete search history.

(56) References Cited

U.S. PATENT DOCUMENTS

| | | | |
|---|---|---|---|
| 3,180,730 A | 4/1965 | Klupfel et al. | |
| 3,567,450 A | 3/1971 | Brantly et al. | |
| 3,658,520 A | 4/1972 | Brantly et al. | |
| 4,036,360 A | 7/1977 | Deffeyes | |
| 4,081,397 A | 3/1978 | Booe | |
| 4,356,429 A | 10/1982 | Tang | |
| 4,539,507 A | 9/1985 | Vanslyke et al. | |
| 4,720,432 A | 1/1988 | Vanslyke et al. | |
| 4,769,292 A | 9/1988 | Tang et al. | |
| 4,885,211 A | 12/1989 | Tang et al. | |
| 5,061,569 A | 10/1991 | Vanslyke et al. | |
| 5,141,671 A | 8/1992 | Bryan et al. | |
| 5,150,006 A | 9/1992 | Van Slyke et al. | |
| 5,151,629 A | 9/1992 | Van Slyke et al. | |
| 5,276,380 A | 1/1994 | Tang | |
| 5,294,870 A | 3/1994 | Tang et al. | |
| 5,304,419 A | 4/1994 | Shores | |
| 5,401,536 A | 3/1995 | Shores | |
| 5,405,709 A | 4/1995 | Littman et al. | |
| 5,484,922 A | 1/1996 | Moore et al. | |
| 5,591,379 A | 1/1997 | Shores | |
| 5,593,788 A | 1/1997 | Shi et al. | |
| 5,645,948 A | 7/1997 | Shi et al. | |
| 5,683,823 A | 11/1997 | Shi et al. | |
| 5,755,999 A | 5/1998 | Shi et al. | |
| 5,776,623 A | 7/1998 | Hung et al. | |
| 5,882,761 A | 3/1999 | Kawami et al. | |
| 5,928,802 A | 7/1999 | Shi et al. | |
| 5,935,720 A | 8/1999 | Chen et al. | |
| 5,935,721 A | 8/1999 | Shi et al. | |
| 6,020,078 A | 2/2000 | Chen et al. | |

(Continued)

FOREIGN PATENT DOCUMENTS

EP     0 732 868     9/1996

(Continued)

*Primary Examiner* — Anne Hines

(74) *Attorney, Agent, or Firm* — McKenna Long & Aldridge LLP

(57) ABSTRACT

A method of encapsulating an OLED device includes forming an OLED device on a substrate; providing a protective cover surrounding the OLED device and the substrate; providing a first sealing arrangement between the protective cover and top surface of the substrate, to define a first chamber enclosing the OLED device; providing a second sealing arrangement sealed to define a second chamber sealed from and enclosing the first chamber; and providing first desiccant material in the first chamber and providing second desiccant material in the second chamber closer to the bottom surface of the substrate than the top surface.

24 Claims, 4 Drawing Sheets

U.S. PATENT DOCUMENTS

| | | | |
|---|---|---|---|
| 6,081,071 A | 6/2000 | Rogers | |
| 6,194,119 B1 | 2/2001 | Wolk et al. | |
| 6,208,075 B1 | 3/2001 | Hung et al. | |
| 6,226,890 B1 | 5/2001 | Boroson et al. | |
| 6,589,675 B2 | 7/2003 | Peng | |
| 6,692,326 B2 * | 2/2004 | Choi et al. | 445/24 |
| 2003/0038590 A1 | 2/2003 | Silvernail et al. | |
| 2003/0110981 A1 | 6/2003 | Tsuruoka et al. | |
| 2003/0122476 A1 | 7/2003 | Wang et al. | |
| 2003/0127976 A1 | 7/2003 | Kim et al. | |
| 2004/0263075 A1 * | 12/2004 | Otsuki et al. | 313/512 |
| 2006/0022592 A1 | 2/2006 | Boroson | |
| 2007/0120157 A1 | 5/2007 | Kim | |
| 2007/0172971 A1 | 7/2007 | Boroson | |

FOREIGN PATENT DOCUMENTS

| | | |
|---|---|---|
| EP | 0 891 121 | 1/1999 |
| EP | 1 009 041 | 6/2000 |
| EP | 1 029 909 | 8/2000 |
| EP | 1 662 573 A | 5/2006 |
| EP | 1 814 178 A2 | 8/2007 |
| JP | 2000 268955 A | 9/2000 |
| WO | WO 98/55561 | 12/1998 |
| WO | WO 00/18851 | 4/2000 |
| WO | WO 00/57676 | 9/2000 |
| WO | WO 00/70655 | 11/2000 |

* cited by examiner

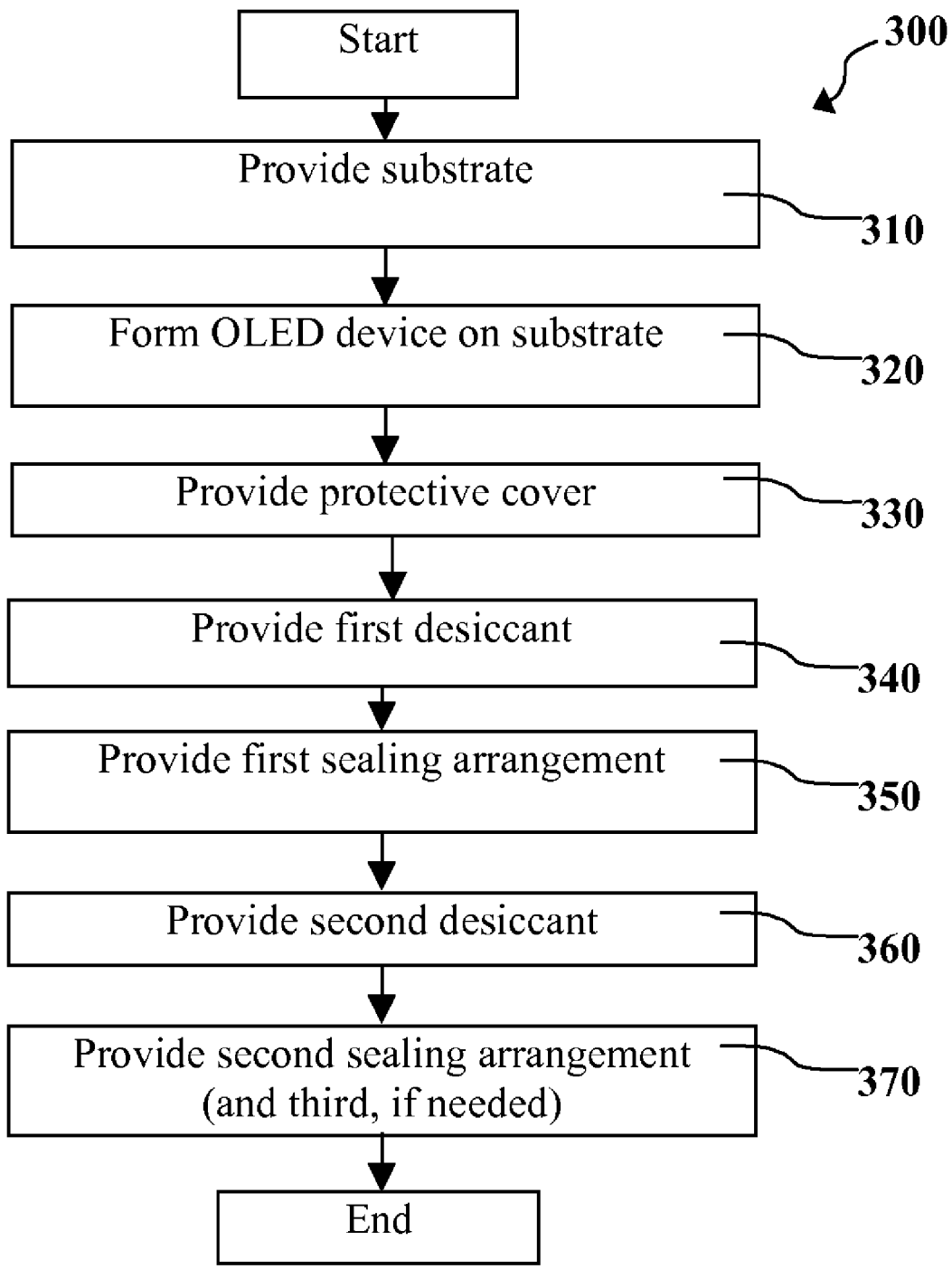

DESICCANT SEALING ARRANGEMENT FOR OLED DEVICES

CROSS REFERENCE TO RELATED APPLICATION

Reference is made to commonly assigned U.S. patent application Ser. No. 11/336,539 filed Jan. 20, 2006 (published as U.S. Published Patent Application No. 2007/0172971) entitled "Desiccant Sealing Arrangement for OLED Devices" by Michael L. Boroson; the disclosure of which is incorporated herein by reference.

FIELD OF THE INVENTION

The present invention relates to protecting OLED devices from moisture.

BACKGROUND OF THE INVENTION

An organic light-emitting diode device, also called an OLED device, commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing, and capability for full-color flat emission displays. Tang et al. described this multilayer OLED device in their U.S. Pat. Nos. 4,769,292 and 4,885,211.

A common problem with OLED displays is sensitivity to moisture. Typical electronic devices require humidity levels in a range of about 2500 to below 5000 parts per million (ppm) to prevent premature degradation of device performance within a specified operating and/or storage life of the device. Control of the environment to this range of humidity levels within a packaged device is typically achieved by encapsulating the device or by sealing the device and a desiccant within a cover. Desiccants such as, for example, molecular sieve materials, silica gel materials, and materials commonly referred to as Drierite materials, are used to maintain the humidity level within the above range. Particular highly moisture-sensitive electronic devices, for example, organic light-emitting devices (OLED) or panels, require humidity control to levels below about 1000 ppm and some require humidity control below even 100 ppm. Such low levels are not achievable with desiccants of silica gel materials and of Drierite materials. Molecular sieve materials can achieve humidity levels below 1000 ppm within an enclosure if dried at a relatively high temperature. However, molecular sieve materials have a relatively low moisture capacity at humidity levels at or below 1000 ppm, requiring large quantities of desiccant when used in the standard methods of the prior art. Because space within the standard enclosure is typically limited to minimize the area and/or depth of the enclosure, low capacity desiccants are typically not used, even when these desiccants have the desirable feature of fast water absorption. In addition, the minimum achievable humidity level of molecular sieve materials is a function of temperature within an enclosure: when using molecular sieve materials in the standard methods of the prior art, moisture absorbed, for example, at room temperature can be released into the enclosure or package during temperature cycling to higher temperature, for example, a temperature of 100° C.

Solid water-absorbing particles currently used within such packaged devices typically include 0.2 to 200 μm particle size powders of metal oxides, alkaline earth metal oxides, sulfates, metal halides, or perchlorates, i.e. materials having relatively low values of equilibrium minimum humidity and high moisture capacity. However, even when finely divided into powders of 0.2 to 200 μm particle size, such materials often chemically absorb moisture relatively slowly compared to the above-mentioned molecular sieve, silica gel, or Drierite materials. Such relatively slow reaction with water vapor can lead to a measurable degree of performance degradation if the rate of moisture permeating through the seal between the device and the cover exceeds the rate of water absorption by the desiccant.

Numerous publications describe methods and/or materials for controlling humidity levels within enclosed or encapsulated electronic devices. Kawami et al., in U.S. Pat. No. 5,882,761, has taught the use of a desiccant layer over the organic layers of an OLED display, between the substrate and the top seal. Kawami et al. teach the use of the following desiccants: alkali metal oxides, alkali earth metal oxides, sulfates, metal halides, and perchlorates. Such materials can be deposited in a predetermined shape by such techniques as vacuum vapor deposition, sputtering, or spin-coating. Boroson et al., in U.S. Pat. No. 6,226,890, disclose the use of a castable blend of the above desiccants with a suitable binder. However, many desiccating agents can be reactive toward the layers and electrodes of OLED devices, and a number of ways have been proposed to keep the desiccating agents from contacting the OLED components when used inside the same enclosure as the OLED components. Kawami et al., in the '761 patent, have taught that the drying agent is to be coated on the inside surface of an airtight container. Boroson et al., in the '890 patent, use the castable blend to coat the interior surface of an enclosure. The requirement that the desiccating agents of the prior art not be reactive toward the layers and electrodes of OLED devices and the requirement to keep the desiccating agents from contacting the OLED components limits the choices of possible desiccating agents.

The methods of Kawami et al., in U.S. Pat. No. 5,882,761 and Boroson et al., in U.S. Pat. No. 6,226,890 rely on the seal between the substrate and the enclosure to limit the rate of water permeation and require sufficient volume within the enclosure to hold enough desiccating agent to absorb moisture for the entire lifetime of the device. These limitations can require very wide seals, and thus wide borders beyond the display area, to prevent the rate of moisture permeation from exceeding the rate of moisture absorption by the desiccating agents. Such an arrangement can require large or deep enclosures to hold sufficient quantities of desiccating agent. For top emitting OLED devices in particular, this enclosure size requirement can be a significant issue since most desiccating agents are not transparent, and therefore cannot be located over the emitting areas of the OLED. For top emitting OLED devices, desiccating agents must typically be placed outside the display area, but still inside the enclosure, resulting in large borders beyond the display area. It is desirable to maintain small borders beyond the display area of OLED devices to minimize the size of a given device and to maximize the number of devices produced on a given mother glass substrate during manufacturing.

Tsuruoka et al., in U.S. Patent Application Publication 2003/0110981, have disclosed a series of transparent drying agents which operate by chemisorption and can be used in an OLED display. These are conceived as useful in OLED devices wherein one wishes to allow light emission through a desiccant layer. However, a desiccant—especially a chemisorption desiccant—is designed to change in the presence of moisture. Therefore, it is possible that the properties of the optical path of the device will change during the device lifetime, leading to potential visual changes in the display. This can limit the usefulness of this method.

Selection of solid water-absorbing particles and the method of applying selected particles to an inner portion of a device enclosure prior to sealing the device within or by the enclosure are governed by the type of device to be protected from moisture. For example, highly moisture-sensitive organic light-emitting devices or polymer light-emitting devices require the selection of particular solid water-absorbing particles and methods of application, since organic materials or organic layers are integral constituents of such devices. The presence of organic materials or layers can, for example, preclude the use of certain solvents or fluids in the application of fluid-dispersed solid water-absorbing particles to organic-based devices. Furthermore, a thermal treatment, if required, of a desiccant contained within a sealed device enclosure, needs to be tailored to the constraints imposed by thermal properties of the organic constituents or layers of the device. At any rate, release of solvent vapors during a thermal treatment of a desiccant disposed within a sealed device enclosure must be avoided or minimized if solvent vapors can adversely affect organic constituents of the device.

Shores, in U.S. Pat. Nos. 5,304,419, 5,401,536, and 5,591,379 discloses moisture gettering compositions and their use for electronic devices. However, many of the desiccants disclosed by Shores will not function effectively with highly moisture-sensitive devices at a humidity level lower than 1000 ppm. Similarly, binders, such as polyethylene disclosed by Shores, which have low moisture absorption rates compared to the absorption rate of the pure selected desiccants, would not function effectively to achieve and to maintain a humidity level below 1000 ppm during a projected operational lifetime of a highly moisture-sensitive device.

Deffeyes, U.S. Pat. No. 4,036,360 describes a desiccating material that is useful as a package insert or on the interior walls of packaging boxes for applications requiring only moderate moisture protection, such as film or cameras. The material includes a desiccant and a resin having a high moisture vapor transmission rate. The desiccants disclosed by Deffeyes are alumina, bauxite, calcium sulfate, clay, silica gel, and zeolite, but Deffeyes does not describe the particle size of any of the desiccants. None of these desiccants, other than zeolite, will function effectively with highly moisture-sensitive devices at a humidity level lower than 1000 ppm, and zeolite has the problem described above of low capacity at humidity levels lower than 1000 ppm. In addition the moisture vapor transmission rate requirement for the resin is not adequately defined since there is no reference to the thickness of the measured resins. A material that transmits 40 grams per 24 hrs per 100 in$^2$ at a thickness of 1 mil would be very different than one that transmits 40 grams per 24 hrs per 100 in$^2$ at a thickness of 100 mils. It is therefore not possible to determine if the moisture vapor transmission rates disclosed by Deffeyes are sufficient for highly moisture-sensitive devices.

Booe, U.S. Pat. No. 4,081,397, describes a composition used for stabilizing the electrical and electronic properties of electrical and electronic devices. The composition includes alkaline earth oxides in an elastomeric matrix. The desiccants disclosed by Booe are barium oxide, strontium oxide, and calcium oxide. Booe teaches the use of particle sizes less than 80 mesh (177 μm) to minimize the settling of oxides within the suspension. Booe does not teach the impact of particle size on desiccant performance. These desiccants will function effectively with highly moisture-sensitive devices at humidity levels lower than 1000 ppm; however, Booe claims the elastomeric matrix has the property of retarding the fluid absorption rate of the alkaline earth particles. In the examples, the water-absorption rate of the compositions is 5 to 10 times slower than the alkaline earth particles alone. This decrease in absorption rate is disclosed as a desirable feature that improves the handling of the highly reactive alkaline earth oxides. In highly moisture-sensitive devices, however, any decrease in the absorption rate of moisture will increase the likelihood of device degradation, and identification of resins that will increase the absorption rate of moisture would be highly desirable. For highly moisture-sensitive devices, therefore, it is important to determine the minimum allowable water vapor transmission rate of the binders used in combination with effective desiccant materials.

Organic light emitting diode (OLED) devices are moisture-sensitive electronic devices that can benefit from improved methods of providing desiccants and have a need for reduced moisture transmission rate into the device. Attempts at this in the art have been less than satisfactory. Kim et al. in U.S. Patent Application Publication 2003/0127976 A1 teach the use of two sealants surrounding an OLED device. While this can be a way to reduce the likelihood of sealant failure, it is no more effective at reducing moisture transmission rate into the device than would be a single wider sealant. Wang et al. in U.S. Patent Application Publication 2003/0122476 A1 show the use of two seals surrounding an OLED device with a desiccant between the two seals, but no desiccant inside the enclosure that contains the OLED device. This can reduce the moisture transmission rate into the device, but does not protect the OLED device from moisture sealed into the enclosure initially nor from moisture that permeates the inner seal. In addition, Wang et al. require the use of ribs that must be formed between the seals in order to hold the desiccant, adding complexity and expense to the fabrication process. Peng in U.S. Pat. No. 6,589,675 B2 also teaches the use of two seals with a desiccant between them. However, Peng requires the use of a separate sealing ring to hold the desiccant, adding extra steps and complexity to the fabrication process. Peng also fails to provide protection for the OLED devices from moisture that penetrates the interior seal. In addition, the methods of Wang et al. and Peng require wide borders beyond the display area to provide space for the two seals and desiccant.

Rogers, U.S. Pat. No. 6,081,071, describes an OLED device on a transparent substrate over which a cover is provided. The cover is attached to the OLED substrate using inner and outer concentric adhesive rings. A "desiccant and/or an inert fluorocarbon liquid" is provided between the adhesive rings and interior of the inner ring. Rogers does not disclose any particular desiccant materials other than metal salts such as $CoCl_2$. As fluorocarbons, Rogers discloses using various commercially available Fluorinert® materials. Rogers clearly teaches that the desiccant is optional and one need only use the fluorocarbon material. Fluorocarbons are not desiccants—they do not bind water. Rather, the function of the fluorocarbon in Rogers is to act as a water barrier, i.e., provide some resistance to water transmission. This is functionally similar to what the adhesive rings do. Rogers fails to recognize the criticality of including an actual desiccant both between the adhesive rings and within the enclosure containing the OLED device. In this embodiment, the method of Rogers is similar to those of Wang et al. and Peng. With no desiccant within the enclosure containing the OLED device, the OLED device is not protected from moisture sealed initially within the enclosure, nor from moisture that permeates the inner adhesive ring. In addition, the method of Rogers, like those of Wang et al. and Peng, requires wide borders beyond the display area to provide space for the two seals and desiccant.

Boroson, U.S. Patent Application Publication 2006/0022592, describes a method for reducing moisture contamination in a top-emitting OLED device. A top-emitting electroluminescent (EL) unit is formed over the top surface of a substrate, wherein the EL unit produces light that is not emitted through the substrate. First and second protective covers are formed over the top and bottom substrate surfaces, respectively, thereby defining first and second chambers, respectively. A moisture-absorbing material is placed within the second chamber and communication between the first and second chambers is provided whereby moisture in the first or second chambers is absorbed by the moisture-absorbing material. Since the emitted light from the OLED device does not pass through the second chamber that contains the desiccant, the choice of desiccants for preserving the lifetime of top-emitting OLED displays is not limited by optical properties. In addition, the choice of desiccant materials is not limited to materials that remain solid after absorbing water since the desiccant is physically separated from the OLED devices. The method described allows for a top-emitting OLED display with a narrow seal and small borders, potentially allowing a top-emitting OLED display to be the same overall area as a bottom-emitting device of the same display area. In addition, locating the desiccant on the non-emitting side of the substrate allows for an OLED with a large capacity for moisture without increasing the display area to accommodate the desiccant. The method described, however, does not address the problem of high moisture permeation rates that can exceed the rate of moisture absorption by the desiccant. Because the first and second chambers are in direct vapor communication, the seal of the first chamber does not provide any additional resistance to moisture permeation beyond a traditional single seal. To decrease the rate of moisture permeation in this method would require the same wide borders as required in the method of Kawami et al. described above.

Therefore, there still remains the need to reduce moisture transmission rate into highly moisture-sensitive devices, such as OLED devices, in a way that does not add to the size of the border required beyond the display area of an OLED device, and also the need to protect these highly moisture sensitive devices from any moisture that penetrates the protective seals encapsulating these devices.

SUMMARY OF THE INVENTION

It is therefore an object of the present invention to reduce the permeability of moisture into an OLED device. It is a further object of this invention to provide the reduced moisture permeability with a minimum non-emitting area on the OLED device. It is a further object of this invention to protect an OLED device from any moisture that penetrates the sealed region containing the OLED device.

This object is achieved by a method of encapsulating an OLED device, comprising:
 (a) forming an OLED device on a substrate;
 (b) providing a protective cover surrounding the OLED device and the substrate;
 (c) providing a first sealing arrangement between the protective cover and top surface of the substrate, to define a first chamber enclosing the OLED device;
 (d) providing a second sealing arrangement sealed to define a second chamber sealed from and enclosing the first chamber; and
 (e) providing first desiccant material in the first chamber and providing second desiccant material in the second chamber closer to the bottom surface of the substrate than the top surface.

It is an advantage of this invention that it reduces the level of moisture inside OLED devices and the permeability of moisture into such devices. It is a further advantage of this invention that it can do this while relying less on highly active desiccants, thus improving ease of manufacture and reducing cost. It is a further advantage of this invention that OLED displays can be formed without the need of completely hermetic seals. It is a further advantage of this invention that it protects OLED devices from moisture that penetrates the sealed region containing the OLED device. It is a further advantage of this invention that OLED displays with a large capacity for moisture can be made without increasing the display size to accommodate the desiccant.

BRIEF DESCRIPTION OF THE DRAWINGS

FIG. 4 shows a block diagram of one embodiment of the method of this invention.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels. The term "top-emitting" refers to display devices in which light is primarily not emitted through the substrate upon which they are based but opposite to the substrate, and are viewed through the side opposite to the substrate. The term "highly moisture-sensitive electronic device" is employed to designate any electronic device that is susceptible to a measurable degradation of device performance at ambient moisture levels greater than 1000 ppm. The term "substrate" is employed to designate organic, inorganic, or combination organic and inorganic solids on which one or more highly moisture-sensitive electronic devices are fabricated. The term "sealing material" is employed to designate organic, inorganic, or combination organic and inorganic materials used to bond encapsulation enclosures to substrates and to protect one or more highly moisture-sensitive electronic devices from moisture by preventing or limiting moisture permeation through the sealing materials. The term "desiccant" is employed to designate organic or inorganic materials used to physically or chemically absorb or react with moisture that would otherwise damage the highly moisture-sensitive electronic devices.

Figure 1:
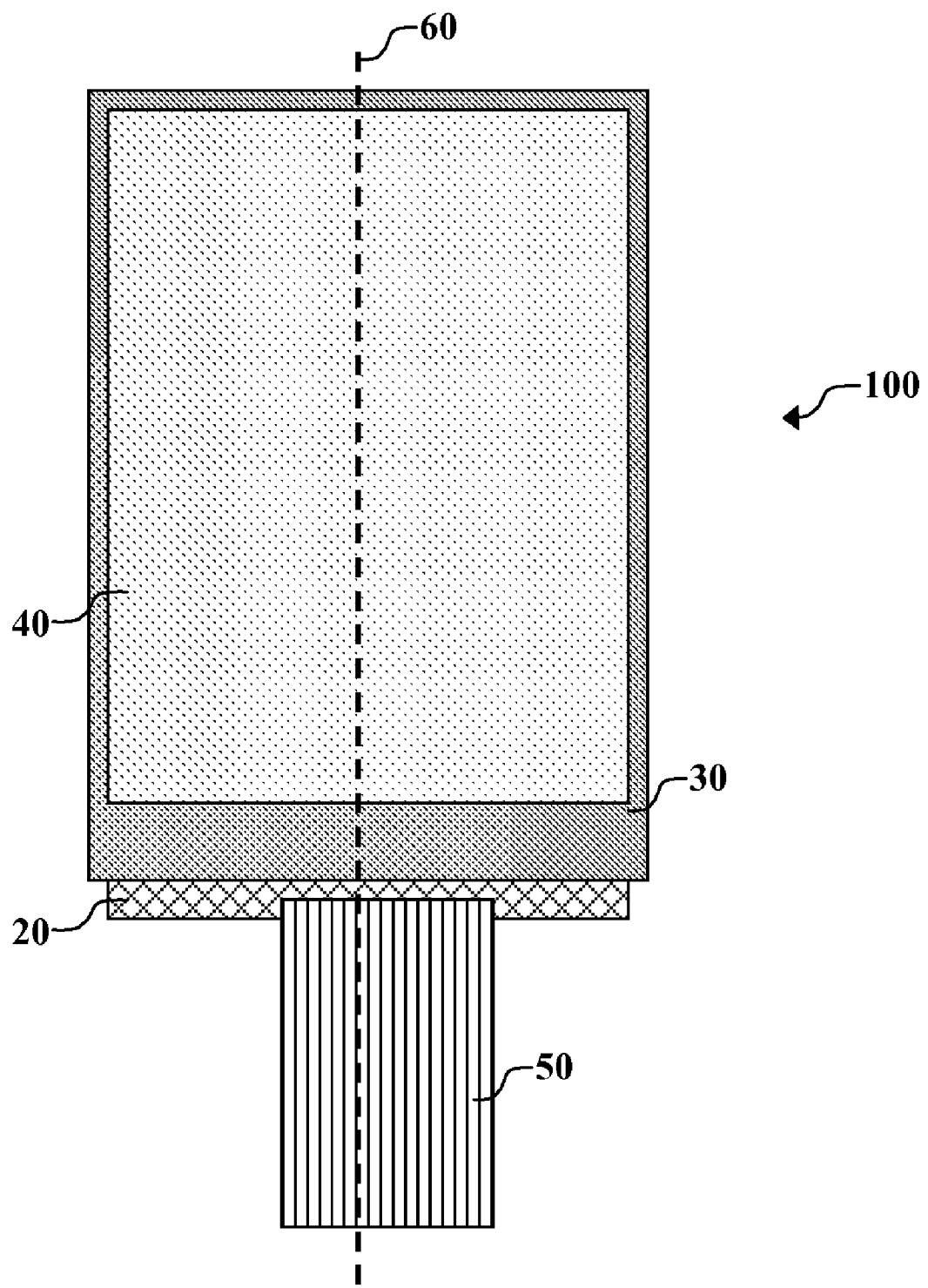
FIG. 1 shows a top view of one embodiment of an OLED device encapsulated by the method of this invention.

Turning now to FIG. 1, there is shown a top view of one embodiment of an OLED device encapsulated by the method of this invention. Encapsulated OLED device 100 includes substrate 20 on which an OLED device has been formed. Flexible connector 50 electrically connects the OLED device to control circuitry. The OLED device and much of substrate 20 are surrounded by a protective cover. In this embodiment, the protective cover includes a transparent portion (protective cover 40) and a non-transparent portion (protective cover 30).

Figure 2:
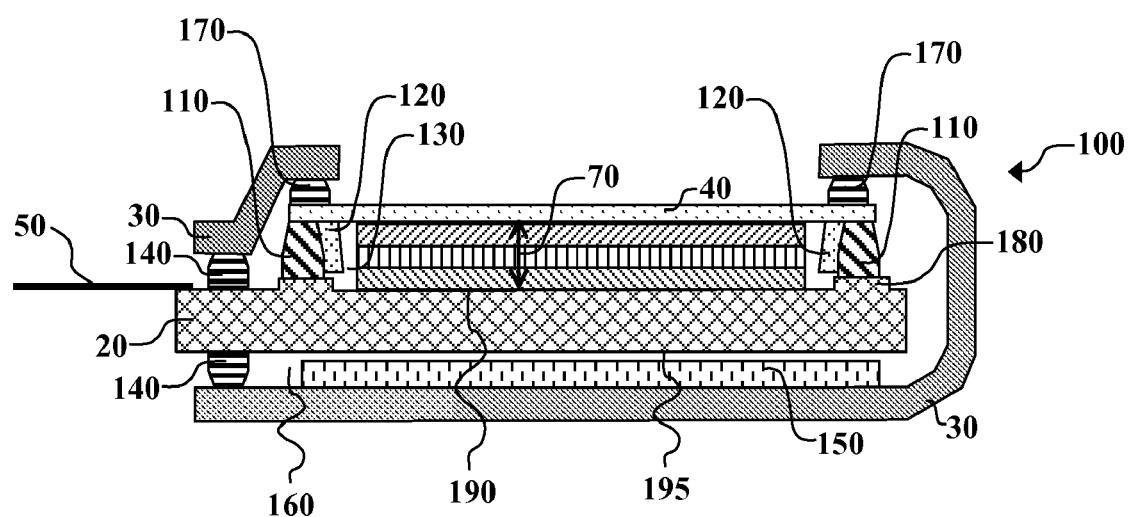
FIG. 2 shows a cross-sectional view of the OLED device of FIG. 1.

Turning now to FIG. 2, there is shown a cross-sectional view of encapsulated OLED device 100 of FIG. 1 at cross-section line 60. OLED device 70 is formed on substrate 20 and is a top-emitting OLED device. Encapsulated OLED device 100 includes the protective cover surrounding OLED device 70 and substrate 20. The protective cover in this embodiment includes two pieces: transparent protective cover 40 and non-transparent protective cover 30. A first sealing arrangement 110 is provided between protective cover 40 and the top surface of substrate 20, which defines first chamber 130 and encloses OLED device 70. First sealing arrangement 110 can optionally include a glass ledge, e.g. 180, on substrate 20, protective cover 40, or both. Such a ledge reduces the area of exposed sealing material. First desiccant material 120 is provided in first chamber 130, e.g. at the inner perimeter of first sealing arrangement 110. A second sealing arrangement 140 is sealed to define second chamber 160, which is sealed and separate from first chamber 130 and encloses first chamber 130. In this embodiment, second sealing arrangement 140 is sealed between protective cover 30 and substrate 20 at a second portion of substrate 20. Second sealing arrangement 140 can optionally include a glass ledge on substrate 20, or on protective cover 30 if protective cover 30 is rigid. Additionally, third sealing arrangement 170 between protective cover 40 and protective cover 30 forms them into a single unified protective cover surrounding OLED device 70 and substrate 20. Second desiccant material 150 is provided in second chamber 160 closer to bottom surface 195 of substrate 20 than to top surface 190, e.g. provided on the bottom surface of substrate 20, or on the inner surface protective cover 30 adjacent to the bottom surface of substrate 20, or a combination of both.

Substrate 20 can be an organic solid, an inorganic solid, or a combination of organic and inorganic solids. Substrate 20 can be rigid or flexible and can be processed as separate individual pieces, such as sheets or wafers, or as a continuous roll. Typical substrate materials include glass, plastic, metal, ceramic, semiconductor, metal oxide, metal nitride, metal sulfide, semiconductor oxide, semiconductor nitride, semiconductor sulfide, carbon, or combinations thereof, or any other materials commonly used in the formation of OLED devices, which can be either passive-matrix devices or active-matrix devices. Substrate 20 can be a homogeneous mixture of materials, a composite of materials, or multiple layers of materials. Substrate 20 can be an OLED substrate, that is a substrate commonly used for preparing OLED devices, e.g. active-matrix low-temperature polysilicon or amorphous-silicon TFT substrate. For this embodiment, where the EL emission is viewed through the top electrode, the transmissive characteristic of the bottom support is immaterial, and therefore can be light transmissive, light absorbing or light reflective. Substrate 20 defines two coplanar surfaces, one of which (the surface on which OLED device 70 is formed) is top surface 190, and the other of which is bottom surface 195.

Protective cover 40 can be an organic solid, an inorganic solid, or a combination of organic and inorganic solids. Protective cover 40 can be rigid or flexible, and can be processed as separate individual pieces, such as sheets or wafers, or as continuous rolls. Typical protective cover materials include glass, plastic, metal, ceramic, semiconductor, metal oxide, metal nitride, metal sulfide, semiconductor oxide, semiconductor sulfide, carbon or combinations thereof. The portion of protective cover 40 over OLED device 70 is transparent, but portions that cover non-emitting regions can be opaque. Protective cover 40 can be a homogeneous mixture of materials, a composite of materials, multiple layers of materials, or an assembly of multiple materials such as a transparent window with an opaque frame. In a useful embodiment, protective cover 40 can include glass.

In addition, protective cover 40 can include one or more optically active layers for imparting desirable properties to OLED device 70 or to its emitted light. Examples of useful optically active layers include color filter arrays for limiting the wavelengths of emitted light, color change modules (e.g. fluorescent layers) for converting a range of wavelengths to another range of wavelengths, light-extraction layers for limiting losses due to total internal reflection, anti-reflection layers, and polarizing layers.

Protective cover 30 can be an organic solid, an inorganic solid, or a combination of organic and inorganic solids, including materials described above for protective cover 40. Protective cover 30 can be rigid or flexible. If rigid, protective cover 30 must be pre-shaped to enclose OLED device 70, and can be formed in two or more pieces that are sealed together to surround OLED device 70 and substrate 20. This restriction is not necessary if protective cover 30 is flexible. Protective cover 30 can be a homogeneous mixture of materials, a composite of materials, multiple layers of materials, or an assembly of multiple materials. In a useful embodiment, protective cover 30 includes a flexible metal foil.

First, second, and third sealing arrangements 110, 140, and 170, respectively, are formed from a sealing material. The sealing material can be organic, inorganic, or a combination of organic and inorganic. The organic sealing material can include epoxies, polyurethanes, acrylates, silicones, polyamides, polyolefins, and polyesters, or combinations thereof. The inorganic sealing material can include glass, ceramic, metal, semiconductor, metal oxide, semiconductor oxide, and metal solder, or combinations thereof. The sealing material can be bonded in a bonding step accomplished by pressing, by melting and cooling, by reaction curing, or by a combination thereof. Typical materials bonded by pressure include pressure-sensitive adhesives. Typical materials bonded by melting and cooling include glass; hot melt adhesives such as polyolefins, polyesters, polyamides, or combinations thereof; or inorganic solders such as indium, tin, lead, silver, gold, or combinations thereof. Typical reaction curing methods include reactions resulting from heat, radiation such as UV radiation, mixing of two or more components, exposure to ambient moisture, removal of ambient oxygen, or combinations thereof. Typical materials bonded by reaction curing include acrylates, epoxies, polyurethanes, silicones, or combinations thereof. Other inorganic materials typically used in sealing materials include glass, ceramic, metal, semiconductor, metal oxide, semiconductor oxide, or combinations thereof. The polymer buffer layer can also function as a protective layer. An example of a useful UV-curable epoxy resin is Optocast 3505 from Electronic Materials Inc. An example of useful pressure sensitive adhesive is Optically Clear Laminating Adhesive 8142 from 3M. Desirably, second sealing arrangement 140 has a greater width than first sealing arrangement 110. The actual sealing arrangement widths can be selected based on the type of sealing material used, the desiccant materials used, and the desired moisture level in contact with OLED device 70.

In some embodiments wherein protective 40 is spaced from OLED device 70, a polymer buffer layer, which can be any number of materials, including UV or heat cured epoxy resin, acrylates, or pressure sensitive adhesive, can be disposed between the OLED device and the protective cover.

First desiccant material 120 is used to physically or chemically absorb or react with moisture that would otherwise damage the highly moisture-sensitive OLED device 70. The level of moisture inside first sealing arrangement 110 must be kept below 1000 ppm, and in some cases even lower. Therefore, first desiccant material 120 has an equilibrium humidity level less than 1000 ppm. Typical moisture-absorbing materials meeting this requirement include metals such as alkali metals (e.g. Li, Na), alkaline earth metals (e.g. Ba, Ca), or other moisture-reactive metals (e.g. Al, Fe); alkaline metal oxides (e.g. $Li_2O$, $Na_2O$); alkaline earth metal oxides (e.g. MgO, CaO, BaO); sulfates (e.g. anhydrous $MgSO_4$); metal halides (e.g. $CaCl_2$); perchlorates (e.g. $Mg(ClO_4)_2$); molecular sieves, especially molecular sieves treated at high temperature; organometallic compounds described by Takahashi et al. in U.S. Pat. No. 6,656,609 and by Tsuruoka et al. in U.S. Patent Application Publication 2003/0110981, including organometallic compounds of the type:

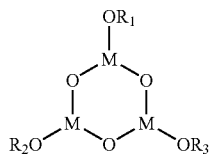

wherein $R_1$, $R_2$, and $R_3$ are selected from the group consisting of alkyl groups, aryl groups, cycloalkyl groups, heterocyclic groups, and acyl groups having one or more carbon atoms, and M is a trivalent metallic atom; organometallic compounds of the type:

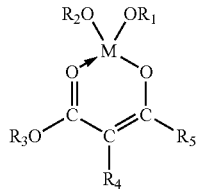

wherein each of $R_1$, $R_2$, $R_3$, $R_4$, and $R_5$ is selected from the group consisting of alkyl groups, alkenyl groups, aryl groups, cycloalkyl groups, heterocyclic groups, and acyl groups having one or more carbon atoms, and M is a trivalent metal atom; organometallic compounds of the type:

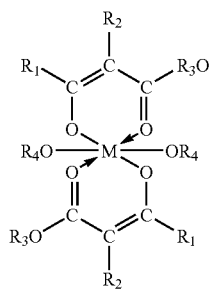

wherein each of $R_1$, $R_2$, $R_3$, and $R_4$ is selected from the group consisting of alkyl groups, alkenyl groups, aryl groups, cycloalkyl groups, heterocyclic groups, and acyl groups having one or more carbon atoms, and M is a tetravalent metal atom; and metals with work functions less than 4.5 eV and capable of being oxidized in the presence of moisture, or combinations thereof. Moisture-absorbing material can be packaged within moisture permeable containers or binders. First desiccant material 120 can be a single material, a homogeneous mixture of materials, a composite of materials, or multiple layers of materials, and can be deposited from a vapor or from solution, or can be provided as particulate material or as particulate material formed in a porous matrix such as a permeable package or tape. Particularly useful desiccant materials include those that are particulate materials formed into a polymeric matrix that can be patterned, as described by Boroson et al. in U.S. Pat. No. 6,226,890.

Second desiccant material 150 in this invention will serve primarily to remove a portion of the moisture that passes through second sealing arrangement 140 and (if present) third sealing arrangement 170. Thus, second desiccant 150 will function to reduce the partial pressure of water vapor against first sealing arrangement 110, thus reducing the rate at which first desiccant material 120—and therefore OLED device 70—will degrade. Since the function of second desiccant material 150 is to reduce the partial pressure of water vapor, it can include a desiccant material with an equilibrium humidity level less than 1000 ppm, or a desiccant material with an equilibrium humidity level greater than 1000 ppm. Examples of the former include those described above for first desiccant material 120. Some examples of the latter include silica gel, materials commonly referred to as Drierite materials, and molecular sieves that have not been treated at high temperatures. Such desiccants generally absorb moisture faster than low-humidity desiccants described above, but can have lower capacity. However, because second chamber 160 has a greater free volume than first chamber 130, one can use a significantly greater amount of second desiccant material 150 than first desiccant material 120, thus providing for a greater amount of moisture protection. In a useful embodiment, second desiccant material 150 has an equilibrium humidity level greater than 1000 ppm, while first desiccant material 120 has an equilibrium humidity level less than that of second desiccant material 150, and desirably less than 1000 ppm. Second desiccant material 150 can be a single material, a homogeneous mixture of materials, a composite of materials, or multiple layers of materials, and can be deposited from a vapor or from solution, or can be provided as particulate material or as particulate material formed in a porous matrix such as a permeable package or tape.

The desiccant materials can be expanding or non-expanding desiccants. By an expanding desiccant, we mean a desiccant that expands in volume upon absorbing moisture. Examples of expanding desiccants include reactive metals such as Li and oxides such as CaO. Such desiccants, when placed in second chamber 160, must not fill the entire chamber. One advantage of non-expanding desiccants, such as molecular sieves, is that they can fill the entire chamber, thus increasing the likelihood that moisture passing into second chamber 160 will interact with and be absorbed by second desiccant material 150. First desiccant material 120 is desirably a low-humidity desiccant as described above. Such desiccants are frequently expanding desiccants. Thus, it can be necessary to leave expansion room for the desiccant, as shown by a gap between first desiccant material 120 and substrate 20. It is desirable that the distance between first desiccant material 120 and substrate 20 be less than the thickness of first sealing arrangement 110.

Figure 3:
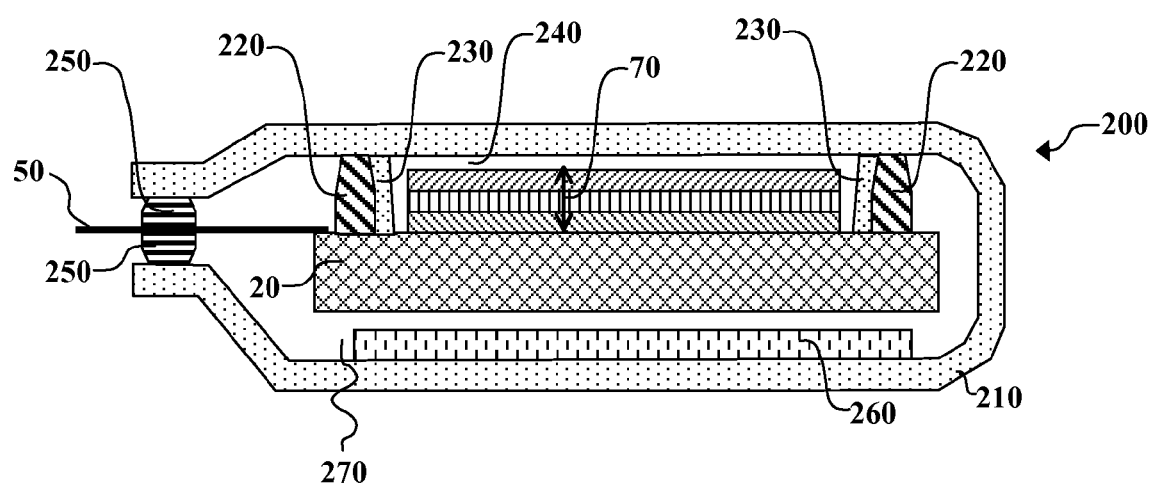
FIG. 3 shows a cross-sectional view of another embodiment of an OLED device encapsulated by the method of this invention.

Turning now to FIG. 3, there is shown a cross-sectional view of another embodiment of an OLED device encapsulated by the method of this invention. Encapsulated OLED device 200 includes OLED device 70 formed on substrate 20 as a top-emitting OLED device and a protective cover 210 surrounding OLED device 70 and substrate 20. Protective cover 210 is transparent and can be rigid, e.g. glass, or flexible, e.g. plastic. A first sealing arrangement 220 is provided between protective cover 210 and the top surface of substrate 20, which defines a first chamber 240 and encloses OLED device 70. A first desiccant material 230 is provided in first chamber 240, e.g. at the inner perimeter of first sealing arrangement 220. A second sealing arrangement 250 is sealed to define a second chamber 270, which is sealed and separate from first chamber 240 and encloses first chamber 240. In this embodiment, second sealing arrangement 140 is sealed between protective cover 210 and flexible connector 50, or between two portions of protective cover 210 in areas that have no flexible connector. A second desiccant material 260 is provided in second chamber 270 closer to the bottom surface than the top surface of substrate 20, e.g. provided on the bottom surface of substrate 20, or on the inner surface protective cover 210 adjacent to the bottom surface of substrate 20, or a combination of both. The first sealing arrangement 220 or second sealing arrangement 250, or both, can include a glass ledge on substrate 20, or on protective cover 210 if the protective cover is rigid. If rigid, protective cover 210 can be formed in two pieces and a third sealing arrangement (not shown) can be used to form a single unified protective cover.

Turning now to FIG. 4, and referring also to FIG. 2, there is shown a block diagram of one embodiment of the method of encapsulating an OLED device according to this invention. At the start of method 300, substrate 20 is provided (Step 310). Then OLED device 70 is formed on substrate 20 by methods well-known in the art (Step 320). Then the protective cover, e.g. protective cover 40 and protective cover 30, is provided (Step 330). First desiccant 120 is provided to what will become first chamber 130, e.g. by placing on one side of protective cover 40 (Step 340), and protective cover 40 is sealed to substrate 20 by providing first sealing arrangement 110 (Step 350) to form first chamber 130. Then second desiccant 150 is provided so that it will be closer to the back of substrate 20 than to the front in what will become second chamber 160 (Step 360), e.g. by providing desiccant 150 on the back of substrate 20, or on the inside of protective cover 30 that will be adjacent to the back of substrate 20. Then second sealing arrangement 140 is provided to seal protective cover 30 to substrate 20, thus forming second chamber 160 (Step 370). In this embodiment, it is also necessary to provide third sealing arrangement 170 (also Step 370) to form a unified protective cover, but this is not necessary for some other embodiments (e.g. encapsulated OLED device 200 in FIG.3).

OLED devices that can be used in this invention have been well described in the art, and OLED device 70 can include layers commonly used for such devices. A bottom electrode is formed over OLED substrate 20 and is most commonly configured as an anode, although the practice of this invention is not limited to this configuration. Example conductors for this application include, but are not limited to, gold, iridium, molybdenum, palladium, platinum, aluminum or silver. Desired anode materials can be deposited by any suitable means such as evaporation, sputtering, chemical vapor deposition, or electrochemical means. Anode materials can be patterned using well known photolithographic processes.

While not always necessary, it is often useful that a hole-transporting layer be formed and disposed over the anode. Desired hole-transporting materials can be deposited by any suitable way such as evaporation, sputtering, chemical vapor deposition, electrochemical process, thermal transfer, or laser thermal transfer from a donor material. Hole-transporting materials useful in hole-transporting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

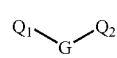

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

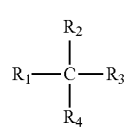

B where:

$R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural Formula C.

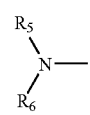

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

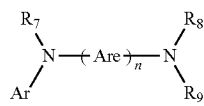

wherein:
  each Are is an independently selected arylene group, such as a phenylene or anthracene moiety;
  n is an integer of from 1 to 4; and
  Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate), also called PEDOT/PSS.

Light-emitting layers produce light in response to hole-electron recombination. The light-emitting layers are commonly disposed over the hole-transporting layer. Desired organic light-emitting materials can be deposited by any suitable means such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, the light-emitting layers of the OLED element include a luminescent or fluorescent material where electroluminescence is produced as a result of electron-hole pair recombination in this region. The light-emitting layers can include a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

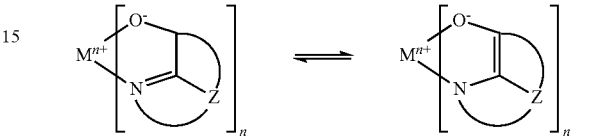

wherein:
  M represents a metal;
  n is an integer of from 1 to 3; and
  Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material in the light-emitting layers can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distryrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

While not always necessary, it is often useful to include an electron-transporting layer disposed over the light-emitting layers. Desired electron-transporting materials can be deposited by any suitable means such as evaporation, sputtering, chemical vapor deposition, electrochemical means, thermal transfer, or laser thermal transfer from a donor material. Preferred electron-transporting materials for use in the electron-transporting layer are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Certain benzazoles are also useful electron-transporting materials. Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials known in the art.

An upper electrode most commonly configured as a cathode is formed over the electron-transporting layer, or over the light-emitting layers if an electron-transporting layer is not used. If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

OLED device 70 can include other layers as well. For example, a hole-injecting layer can be formed over the anode, as described in U.S. Pat. No. 4,720,432, U.S. Pat. No. 6,208,075, EP 0 891 121 A1, and EP 1 029 909 A1. An electron-injecting layer, such as alkaline or alkaline earth metals, alkali halide salts, or alkaline or alkaline earth metal doped organic layers, can also be present between the cathode and the electron-transporting layer.

A thin-film encapsulation layer can be provided over OLED device 70 as described by Boroson in the above cited U.S. Published Patent Application No. 2007/0172971 to prevent contamination of the light-producing unit by oxygen or moisture. The thin-film encapsulation layer can include organic, inorganic, or mixed organic and inorganic materials and can include a single layer or multiple layers of different materials or mixtures of materials. Some non-limiting examples of thin-film encapsulation layer materials include metal oxides such as aluminum oxide; metal nitrides; metal oxynitrides; diamond-like carbon; semiconductor oxides such as silicon dioxide; semiconductor nitrides such as silicon nitride; semiconductor oxynitrides such as silicon oxynitride; multilayer materials such as aluminum oxide/acrylate polymers as provided by Vitex Corp.; polymer layers such as parylene, epoxy, polyester, polyolefins, etc.; organic or organometallic compounds such as aluminum trisoxine (ALQ) or 4,4'-Bis[N-(1-naphthyl)-N-phenylamino]biphenyl (NPB); multiple layers of organic, inorganic, or both organic and inorganic materials; or mixtures of any of these. The thin-film encapsulation layer is typically provided in a thickness of ten to several hundreds of nanometers.

The invention has been described in detail with particular reference to certain preferred embodiments thereof, but it will be understood that variations and modifications can be effected within the spirit and scope of the invention.

PARTS LIST

- 20 substrate
- 30 protective cover
- 40 protective cover
- 50 flexible connector
- 60 cross-section line
- 70 OLED device
- 100 encapsulated OLED device
- 110 sealing arrangement
- 120 desiccant material
- 130 chamber
- 140 sealing arrangement
- 150 desiccant material
- 160 chamber
- 170 sealing arrangement
- 180 glass ledge
- 190 top surface
- 195 bottom surface
- 200 encapsulated OLED device
- 210 protective cover
- 220 sealing arrangement
- 230 desiccant
- 240 chamber
- 250 sealing arrangement
- 260 desiccant
- 270 chamber
- 300 method
- 310 block
- 320 block
- 330 block
- 340 block
- 350 block
- 360 block
- 370 block

The invention claimed is:

1. A method of encapsulating a top-emitting OLED device, comprising:
   (a) forming a top-emitting OLED device on a substrate;
   (b) providing a protective cover surrounding the OLED device and the substrate;
   (c) providing a first sealing arrangement after the step (b) to form a first chamber between the protective cover and top surface of the substrate, which encloses the OLED device;
   (d) providing a second sealing arrangement sealed to define a second chamber sealed from and enclosing the first chamber; and
   (e) providing first desiccant material in the first chamber at the inner perimeter of the first sealing arrangement and providing second desiccant material in the second chamber closer to the bottom surface of the substrate than the top surface.

2. The method of claim 1 wherein the substrate defines two coplanar surfaces.

3. The method of claim 1 wherein the first and second desiccant materials are particulate materials or particulate materials formed into a matrix.

4. The method of claim 1 wherein the first desiccant material has an equilibrium humidity level less than that of the second desiccant material.

5. The method of claim 4 wherein the first desiccant material has an equilibrium humidity level less than 1000 ppm.

6. The method of claim 4 wherein the second desiccant material has an equilibrium humidity level greater than 1000 ppm.

7. The method of claim 1 wherein the second desiccant material absorbs moisture faster than the first desiccant material.

8. The method of claim 1 further providing one or more thin-film encapsulation layers over the OLED device.

9. The method of claim 1 wherein the protective cover is spaced from the OLED device and a polymer buffer layer is disposed between the OLED device and the protective cover.

10. The method of claim 1 wherein the first sealing arrangement or the second sealing arrangement or both include a glass ledge.

11. The method of claim 1 further providing that the distance between the first desiccant material and the substrate is less than the thickness of the first sealing arrangement.

12. The method of claim 1 wherein the protective cover comprises two or more pieces and a third sealing arrangement between them that forms a single unified protective cover.

13. The method of claim 1 wherein the second sealing arrangement is sealed to a second portion of the substrate between the protective cover and the substrate.

14. The method of claim 13 wherein the substrate defines two coplanar surfaces.

15. The method of claim 13 wherein the first and second desiccant materials are particulate materials or particulate materials formed into a matrix.

16. The method of claim 13 wherein the first desiccant material has an equilibrium humidity level less than that of the second desiccant material.

17. The method of claim 16 wherein the first desiccant material has an equilibrium humidity level less than 1000 ppm.

18. The method of claim 16 wherein the second desiccant material has an equilibrium humidity level greater than 1000 ppm.

19. The method of claim 13 wherein the second desiccant material absorbs moisture faster than the first desiccant material.

20. The method of claim 13 further providing one or more thin-film encapsulation layers over the OLED device.

21. The method of claim 13 wherein the protective cover is spaced from the OLED device and a polymer buffer layer is disposed between the OLED device and the protective cover.

22. The method of claim 13 wherein the first sealing arrangement or the second sealing arrangement or both include a glass ledge.

23. The method of claim 13 further providing that the distance between the first desiccant material and the substrate is less than the thickness of the first sealing arrangement.

24. The method of claim 13 wherein the protective cover comprises two or more pieces and a third sealing arrangement between them that forms a single unified protective cover.

* * * * *